United States Patent [19]
Zinke

[11] Patent Number: 5,793,119
[45] Date of Patent: Aug. 11, 1998

[54] THERMOELECTRIC POWER GENERATION USING PULSE COMBUSTION

[76] Inventor: Robert D. Zinke, 12374 Greenway Dr., Sterling Heights, Mich. 48312

[21] Appl. No.: 560,034

[22] Filed: Nov. 17, 1995

[51] Int. Cl.[6] ............................................. F02C 6/00
[52] U.S. Cl. ........................... 290/2; 136/205; 126/110 E
[58] Field of Search .................................. 136/212, 208, 136/205, 220, 217, 225, 224; 290/2, 1 R, 1 A; 310/306; 322/2 R; 431/1

[56] References Cited

U.S. PATENT DOCUMENTS

| | | | |
|---|---|---|---|
| 2,362,259 | 11/1944 | Findley | 126/110 E |
| 3,794,527 | 2/1974 | Kim | 136/208 |
| 3,808,056 | 4/1974 | Pitcher et al. | 136/208 |
| 4,014,713 | 3/1977 | Markman et al. | 136/210 |
| 5,120,332 | 6/1992 | Wells | 96/146 |
| 5,427,086 | 6/1995 | Brownell | 126/110 R |
| 5,541,464 | 7/1996 | Johnson et al. | 310/306 |

FOREIGN PATENT DOCUMENTS 62-54981  3/1987  Japan .

*Primary Examiner*—Clayton E. LaBalle
*Assistant Examiner*—Nicholas Ponomarenko
*Attorney, Agent, or Firm*—John R. Benefiel

[57] ABSTRACT

A thermoelectric generator uses pulse combustion to generate heat used to heat plate elements of a thermopile in order to efficiently generate electricity. Stacked plates forming the thermopile also form an opening defining a combustion chamber and exhaust system. The exhaust system has a greater flow resistance adjacent the combustion chamber so that a self-sustaining pulse combustion can be maintained at lower temperatures.

10 Claims, 4 Drawing Sheets

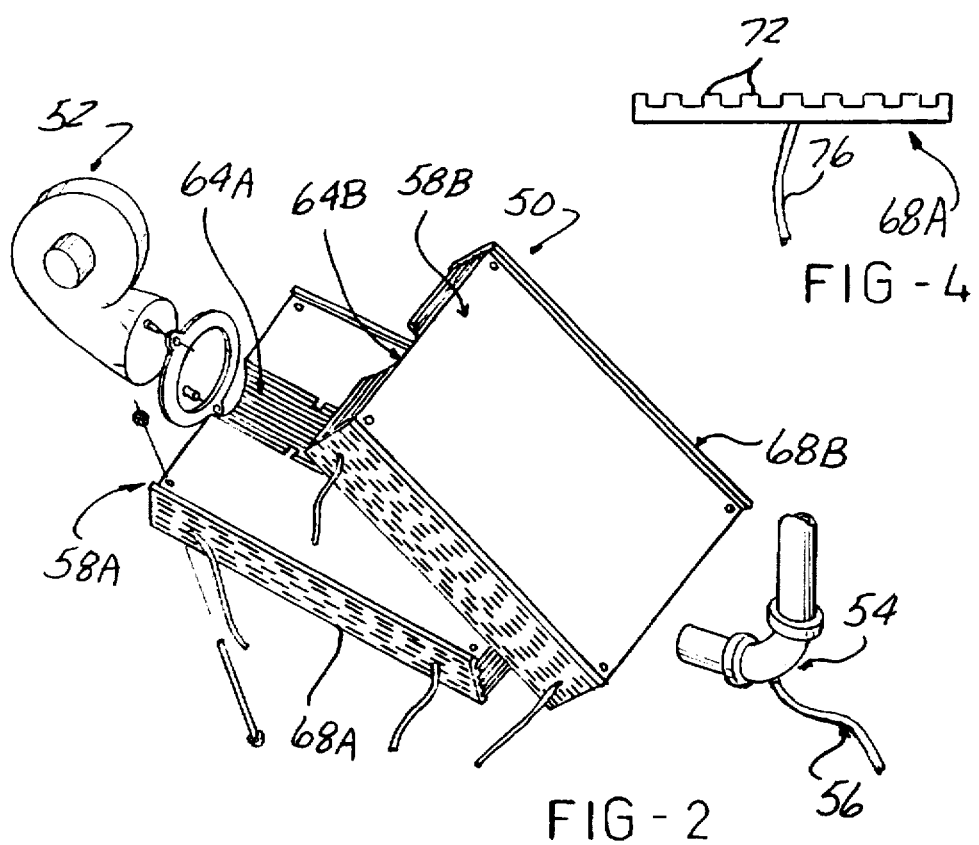
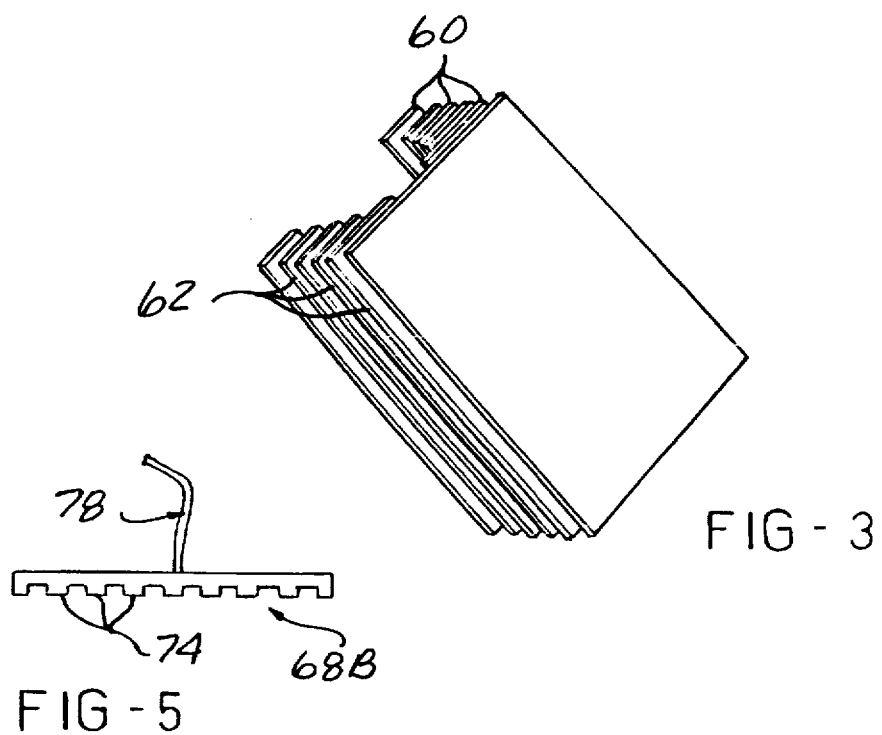

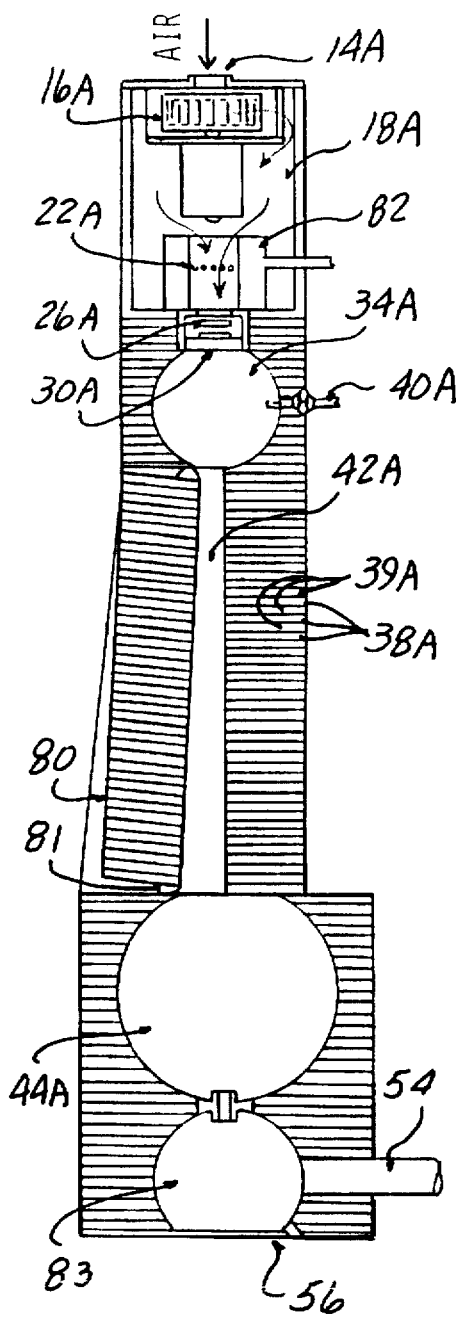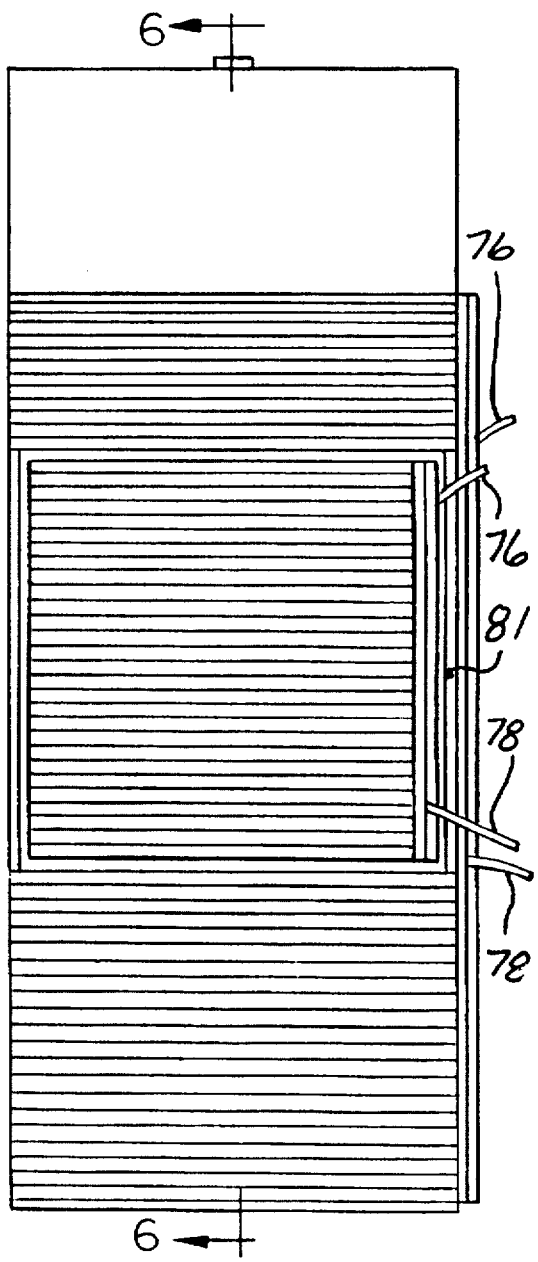
FIG-6
FIG-7

THERMOELECTRIC POWER GENERATION USING PULSE COMBUSTION

3BACKGROUND OF THE INVENTION

This invention concerns electrical power generation using thermoelectric effects. The combination of an internal combustion engine with a thermoelectric pile to generate electricity has previously been proposed. See U.S. Pat. No. 4,767,467 issued on Aug. 30, 1988 which describes a shell formed from thermoelectric elements, combustion in the chamber heating the interior end of the thermoelectric elements thereby creating a temperature difference which generates electricity.

See also U.S. Pat. No. 3,497,397 issued on Feb. 24, 1970.

A major problem with thermoelectric power generation is the poor efficiency of the process. When using the heat of internal combustion, the efficiency of the transfer of heat to the thermoelectric elements has a great effect on the overall efficiency of the process.

The object of the present invention is to provide a thermoelectric power generator using a combustion device as a heat source which is more efficient than such generators which have previously been proposed.

SUMMARY OF THE INVENTION

The above object and other objects, which will be understood upon a reading of the following specification and claims, are achieved by the combination of a pulse combustion device as a heat source with a thermopile surrounding the combustion chamber and exhaust system of the pulse combustion device to create a thermoelectric generator.

Highly effective heat transfer conditions are created by the use of a pulse combustion process as a heat source, due to the fact that none of the heat energy has to be wasted for the purpose of venting flue products and the constant pulsation of the hot gases in the exhaust pipe enables better heat transfer from the gas to the surrounding walls (the condition of stagnant or laminar gas flow next to the walls is alleviated).

The thermoelectric elements preferably comprise a series of stacked plates of alternately different materials, the plates cut out in their central region to define the combustion chamber exhaust pipe, decoupler, etc.

In a simplified embodiment with a straight exhaust pipe, two housing sections are formed from stacks of plates of alternating materials, each housing section defining one half of the internal cavities. The stacks are comprised of spaced pairs of plate sections of increasing width, with a final single plate joining the pair sets, forming an approximate semicircular trough. The housing sections, when assembled together form a generally cylindrical passage which comprises the combustion chamber, exhaust pipe, exhaust decoupler, and muffler, and heat transfer is directed into the edge surfaces presented to the interior of the cylindrical lengthwise passage. The housing sections are assembled after installation of components such as fuel nozzles, flapper valves, flame traps, blowers, etc.

The entire assembly is therefore a thermopile with the capability of burning fossil fuel in its interior cavity.

DESCRIPTION OF THE DRAWINGS

FIG. 2 is an exploded perspective view of an alternate embodiment of the present invention with two housing sections.

FIG. 3 is an exploded view of one of the housing sections shown in FIG. 2.

FIGS. 4 and 5 are side elevational views of power bus connectors attached to each housing shown in FIGS. 2 and 3 to tap the electrical power generated.

FIG. 6 is a diagrammatic representation of another embodiment of the pulse combustion generator according to the invention.

FIG. 7 is a plan view of the exterior of the pulse combustion generator shown in FIG. 6.

DETAILED DESCRIPTION

Figure 1:
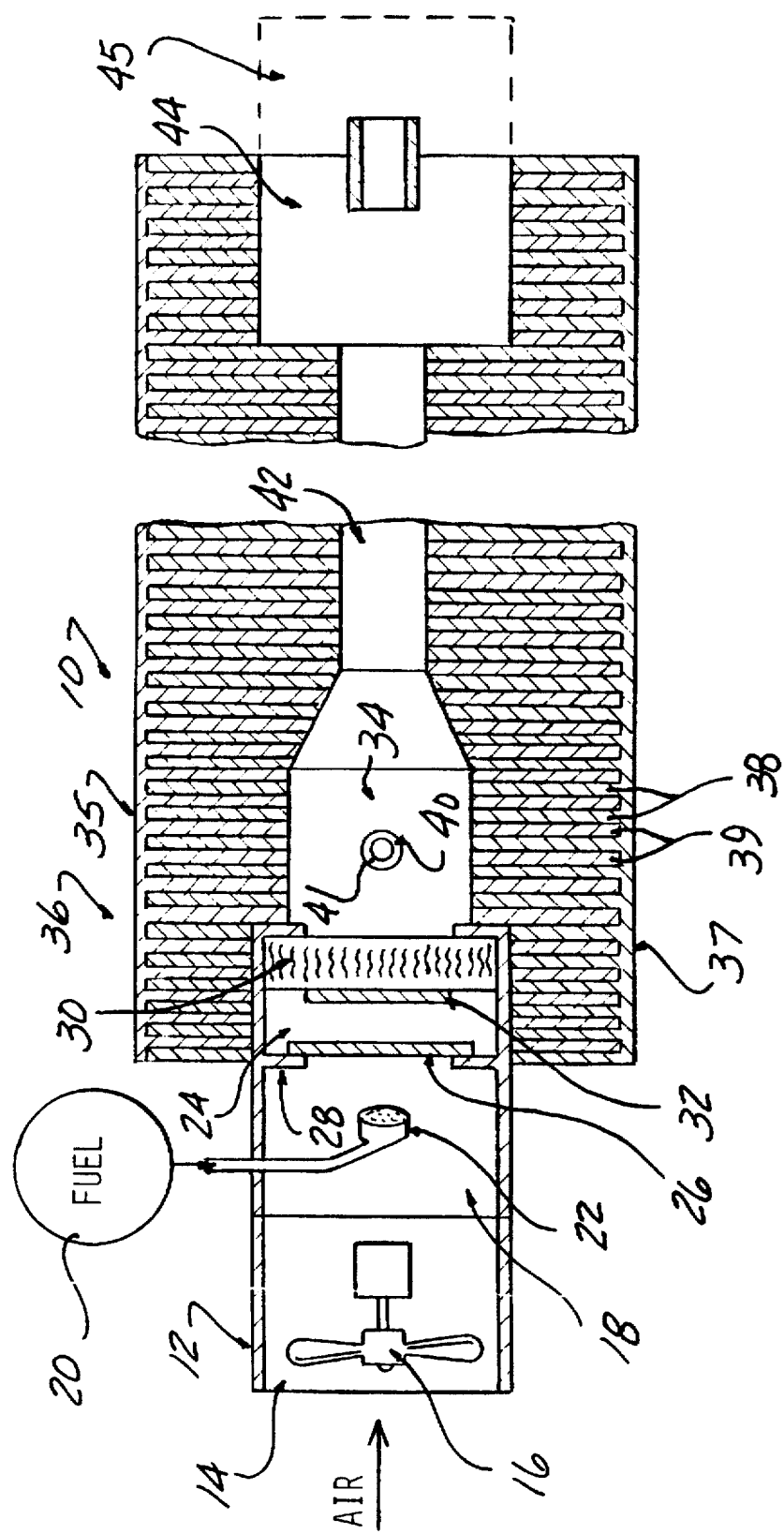
FIG. 1 is a diagrammatic representation of a pulse combustion thermoelectric generator according to the present invention.

In the following detailed description, certain specific terminology will be employed for the sake of clarity and a particular embodiment described in accordance with the requirements of 35 USC 112, but it is to be understood that the same is not intended to be limiting and should not be so construed inasmuch as the invention is capable of taking many forms and variations within the scope of the appended claims.

The present invention utilizes pulse combustion as a heat source. Pulse combustion has recently been applied to central heating plants for homes and businesses, hot water heaters, and similar devices.

In pulse combustion installations, a charge of a fuel-air mixture is initially forced into a combustion chamber and ignited. The mixture explodes, the gaseous products rapidly expanding into one or more exhaust pipes, thence into an exhaust "decoupler." The spent gases are thereafter exhausted from the system. In these applications, high efficiency heat generation is achieved since the rapidly repeated explosive combustion of the fuel-air mixture creates a dynamic expulsion of the combustion products which allows cooling of the gases to a much greater degree, enabling the extraction of a greater proportion of heat energy.

In conventional heating plants, the gases cannot be cooled to this degree since heat energy is used to exhaust the gases from the system, and the gases must be exhausted at higher temperatures, reducing the efficiency of the process.

If the flow resistance of the exhaust pipe is designed properly, a slight vacuum develops momentarily in the combustion chamber as a result of the momentum of the rapidly expanding gases, which vacuum causes drawing in of a fresh charge. The fresh charge is reignited by a reflected pressure wave or by the products of the previously combusted charge of the fuel-air mixture and a self-sustaining "pulse" combustion proceeds.

The exhaust pipe must present an ever decreasing flow resistance downstream so that as the rate of cooling of the gases changes due to a reduced rate of heat transfer and decreasing gas temperatures, the pulsing combustion will be able to continue. This allows a continuous generation of electricity by the generator even after thermal equilibrium of the generator has been established.

Accordingly, pulse combustion is highly efficient and requires only minimal componentry since the explosive combustion of the charge causes the forced exhaustion of the combustion gases to minimize the heat energy used to vent the exhaust gases.

With proper design, the exhaust gases can be cooled considerably by heat transfer into the surrounding structure while maintaining a self-sustained pulse combustion process. A careful balance in flow dynamics must be maintained so that the explosive outflow of exhaust gases continues to create a momentary vacuum in each pulse combustion interval to draw in a fresh charge on a self-sustaining basis. The exhaust decoupler is so-called since it must be large enough to present minimal flow resistance and substantially dissipate the pressure pulsations. If not sufficiently large, the pulsed combustion process can be adversely affected.

Referring to the drawings and particularly FIG. 1, a thermoelectric power generator 10 according to the present invention is depicted in diagrammatic form. Thermoelectric generator 10 includes a housing 12 defining an air inlet 14 into which an air flow is directed, initially induced by a blower 16.

The housing 12 also defines an air inlet chamber 18 into which fuel from a source 20 is sprayed through an atomizer head 22. Once pulsing combustion has started, the fuel can flow at a constant rate or be intermittently interrupted by a separate fuel-only flapper valve (not shown). To prevent explosions in the housing during start-up, a purge cycle (fan only operation for a few seconds) may be desired prior to fuel introduction or spark initiation.

The housing 12 is adjacent to a flapper valve section 24 communicating with the air inlet chamber 18 whenever a flapper valve 26 is moved off a valve seat 28 defined by a partition plate.

A flame arrester 30 is spaced across from the flapper valve seat 28 and has a stop plate 32 affixed thereto and aligned to be engaged by the flapper valve 26, as will be described.

The flame arrester 30 comprises a well known open metallic mesh structure which allows passage of the fuel-air mixture into the combustion chamber 34, but prevents a flame front from propagating in a reverse direction.

The combustion chamber 34 is defined by a central opening in an assembly 36 of stacked annular plates 38, 39 (including spark plug opening 40) defining the combustion chamber 34.

The plates 38, 39 are of differing materials of a type which exhibit the thermoelectric effect when a junction between the two materials is heated to set up a temperature differential extending along the plates, for example copper and iron. The plates 38, 39 have their inner perimeter edges joined as by welding, soldering, or brazing. This joining creates a thermocouple junction in the well known manner, so that the assembly 36 comprises a thermopile. Electrical fitting 35 engages the outer side edges of plates 38 and electrical fitting 37 engages the outer side edges of plates 39. Electrical fittings 35, 37 are provided with cables for distribution of the electrical current generated to a utilization device.

A spark plug or other ignitor 41 is mounted projecting into the combustion chamber 34 through the opening 40 provided in the stack plate assembly 36. In addition to combustion chamber 34, an exhaust pipe 42 and an exhaust decoupler 44 are also defined within plate assembly 36 in communication therewith to successively receive the products of the explosive combustion. The exhaust pipe 42 must have the proper flow resistance as described above. From exhaust decoupler 44, exhaust gases are vented to a muffler 45 (if necessary because of noise) and from the muffler 45 to an exhaust flue or chimney (not shown).

To initiate operation, the blower 16 is energized, directing an air flow into the air decoupler/muffler 18, with a fuel charge sprayed into the air through atomizer head 22. The flapper valve 26 is initially positioned over the stop plate 32, allowing flow of a charge of the air-fuel mixture into the combustion chamber 34, where it is ignited with the spark plug 41.

The pressure generated by the resulting explosive combustion of the air-fuel mixture causes the flapper valve 26 to move onto the valve seat 28, causing the combustion chamber 34 to be isolated from the air inlet chamber 18 and thus preventing the flow of additional fuel-air mixture into the combustion chamber 34.

A large proportion of the heat developed by the combustion in chamber 34 is transferred into the plate assembly 36 since exhaust air flow is caused by mechanical action, i.e., by the effect of detonations in the combustion chamber 34 and excess heat is not necessary to vent exhaust gases.

This heat causes thermoelectric power generation by the heating of the inside edges of the plates 38, 39. Electrical connectors 35, 37 are connected to the respective outer edges of the plates 38, 39, allowing conduction of the electrical current to a using device.

The products of combustion explosively expand into the exhaust system 42, 44 in such a manner that a vacuum momentarily develops in the combustion chamber 34, causing flapper valve 26 to again unseat and inducing flow of another charge of air/fuel mixture into the chamber 34.

After start up, the pulse combustion cycles repeat continuously without the need for the blower 16 or ignitor 41.

FIGS. 2 and 3 show components of a particular embodiment of the invention, in which a two-piece housing 50 encloses all of the internal components described above, save for an external blower 52 and exhaust flue or chimney 54 (which would include a condensate line 56) which are attached to either end of the housing 50.

Housing 50 is comprised of housing sections 58A, 58B, each comprised of an assembly of segments of stacked plates 60, 62 arranged with the edges aligned side-by-side with an intervening cutout of alternately differing thermoelectric materials, such as copper and iron.

Each housing section 58A, 58B defines one-half of an internal passageway 64A, 64B when the two sections are assembled together. The passageways 64A, 64B are created by sections cut out of segments of plates 60, 62, which are spaced apart to a decreasing extent as the width of the plate increases. The outermost plate joins the spaced-apart sets of plates together with the entire assembly held together with suitable bolts or other fastening techniques.

The various internal components (not shown) are assembled to one of the housing sections 58A or 58B, and these sections are then assembled together.

The inside edges of the plates 60, 62 define the outer perimeter of the path of gaseous material flow, including the combustion chamber described above, so that these edges comprise the "hot" junction of the contacting inner edges of the plates 60, 62.

Thus, electrical power is generated by the thermoelectric effect created by the difference in temperature between the inner edges at the junction, and the outer edges, with the current being collected by connector buses 68A, 68B, having spaced contacts 72, 74 engaging the outside edges of respective plates 60, 62.

The electrical cables 76, 78 distribute the current to a utilization device (not shown) for use of the electrical power so generated.

This construction further enhances the heat transfer, as all of the components arranged along the gaseous flow path are enclosed by the thermopile.

The use of the pulse combustion process fundamentally improves the efficiency of power generation since heat transfer is not affected by stationary boundary layer or laminar flow effects of typically continuously flowing gaseous products.

The construction of this device is not limited to the use of thermopile materials. This generator may be constructed of any thermoelectric material.

It should be understood that this device is not limited to only one flapper valve, one combustion chamber, one exhaust pipe, or that the exhaust pipe has to be straight or that it must be of circular cross section.

FIGS. 6 and 7 show a version which may be useful for prototype development. Exhaust pipe 42A has a rectangular cross section in this configuration. Here, however, the shape (and therefore the operational characteristics of the pulse combustion process) of the exhaust pipe 42A can be changed by swinging exhaust flow plate 80 back and forth until optimum operation is achieved. It is important that airtight, heat resistant seal 81 is in place before the pulse combustion process is started.

It is not necessary that combustion chamber 34A or exhaust decoupler 44A be of circular cross section. It is important that these components be sized properly in relation to each other so that the pulse combustion process can take place and do so without unacceptably high carbon monoxide emissions.

Other components shown in FIG. 6 are fuel decoupler 82, which isolates the fuel supply from pressure pulsations in the combustion chamber. An exhaust muffler 83 could be included to reduce noise.

It is particularly important that the pulse combustion process continues even after the pulse combustion device has achieved thermodynamic equilibrium. This would allow an electrical generator to produce a steady amount of electricity indefinitely. This capability enables this device to generate electrical power for a house, be used to power automobiles, etc. It is of course a prerequisite that the combustion chamber, exhaust pipes, and exhaust decoupler are sized properly in relation to each other. The exhaust decoupler, for example, must be several times larger than the combustion chamber to account for the expansion of gases as a result of explosive combustion.

The more efficient designs will have more than one curved exhaust pipe and each exhaust pipe may have a series of bends for efficient heat transfer. To make the pulse combustion possible with lower flue (chimney) temperatures and once thermal operating equilibrium has been established, it is important that the bends close to the combustion chamber have greater resistance (and heat transfer) to the flow of hot air than those bends farther downstream, as mentioned above. This resistance is measured by determining the Nusselt number (Nu) which is a combination of the Prandtl number (Pr) and the Reynolds number (Re). The Colburn correlation:

$$Nu = 0.023 \ Re^{0.8} \ Pr^{1/3}$$

works well for this application.

Figure 8:
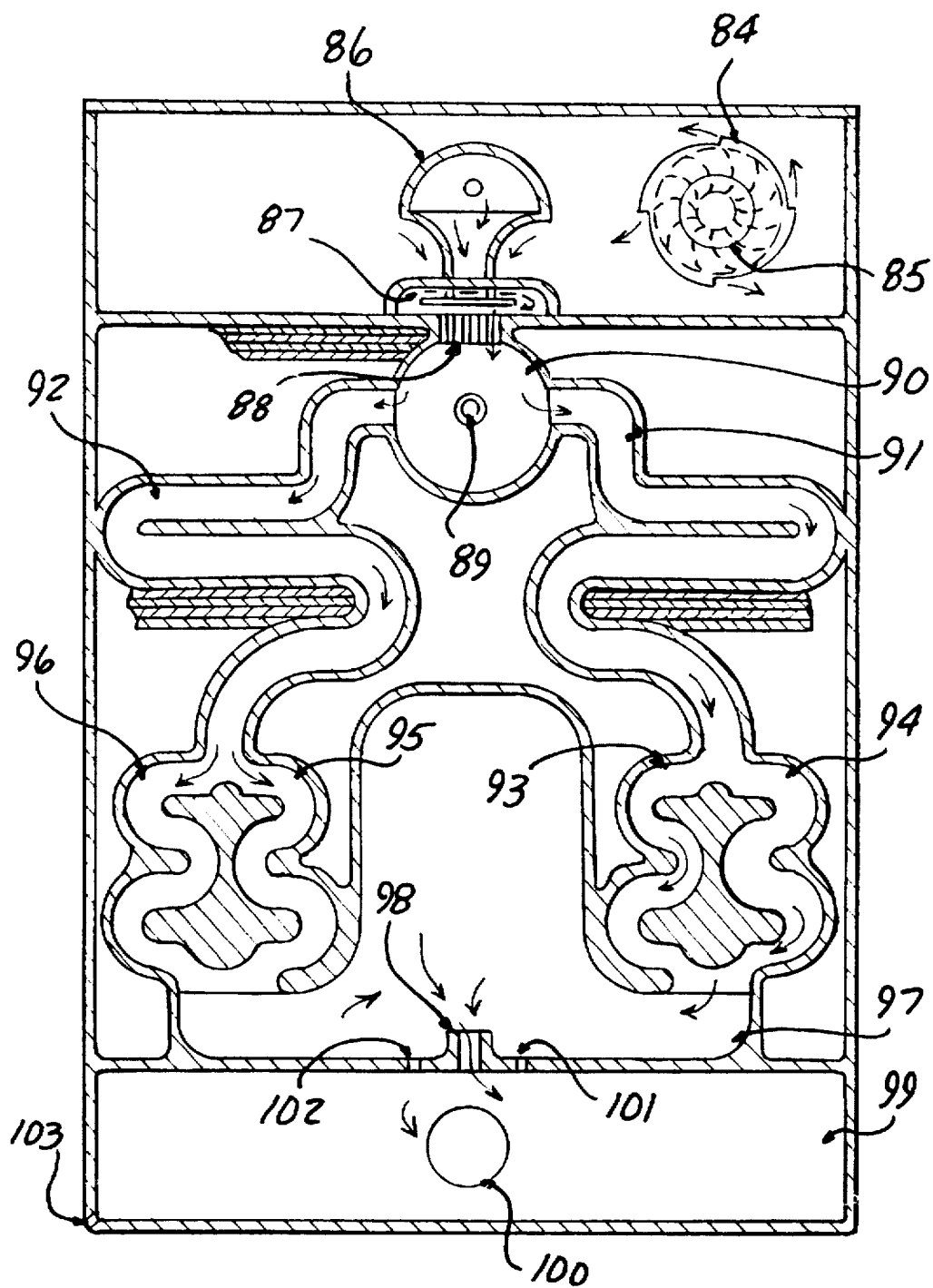
FIG. 8 is a plan view of another embodiment of the pulse combustion generator according to the present invention.

FIG. 8 shows a version of the pulse combustion device using dual curved exhaust pipes. The complete thermopile is not shown, but a series of alternating plates of differing material would surround the various components as in the above embodiments.

A positive displacement impeller 84 provides startup air flow, powered by an electric motor 85. Natural gas fuel enters the system at the gas decoupler 86. Directly below gas decoupler 86 is a chamber containing a flapper valve that regulates fuel only and is disc shaped. The air flapper valve 87 is ring shaped. Flame trap 88 prevents upstream detonations because fuel/air flow through it is laminar. Spark plug 89 is positioned so that sparks are generated in combustion chamber 90 during startup.

Combustion chamber 90 is of sufficient volume to contain enough fuel/air mixture (at standard atmospheric pressure) so that there is barely enough energy to push exhaust gases downstream through the exhaust pipes. Two exhaust pipes 91 and 92 open into combustion chamber 90. Each exhaust pipe splits into two exhaust pipe branches 93, 94 and 95, 96 farther downstream. Exhaust pipes 93, 94, 95, 96 discharge into exhaust decoupler 97, which is of sufficient volume to contain the detonated fuel/air mixture and permit upstream combustion to be complete enough so that carbon monoxide production meets legal requirements.

Exhaust gases flow from exhaust decoupler 97 through orifice 98 and into muffler 99. Exhaust vent 100 leads to chimney tube (not shown). Condensate holes 101, 102 and 103 permit liquid to drain from the system.

I claim:

1. A thermoelectric generator including a pulse combustion device, said device comprising:

a housing defining an internal air flow passage;

blower means for forcing air flow into said passage only during start up of said pulse combustion device, said blower means ceasing operation after start up;

means for inducing a flow of fuel into said air flow in said passage;

a combustion chamber located in a downstream portion of said air flow passage;

flapper valve means isolating an upstream portion of said air passage from said combustion chamber upon initiation of combustion in said combustion chamber;

ignitor means for initiating combustion of said fuel in said combustion chamber;

an exhaust system including an exhaust decoupler to receive combustion products explosively expanding out of said combustion chamber and to complete the combustion thereof started in said combustion chamber, decreasing flow resistance in said exhaust system into the outflow of said gaseous products of combustion in regions further from said combustion chamber;

pulse combustion cycles continuously and self sustainingly repeating in said combustion chamber as long as fuel flow is induced into said air flow by the action of said flapper valve causing an outflow of gaseous combustion products;

a stack of plates of alternating composition of materials generating a thermoelectric effect assembled to surround said combustion chamber and at least a part of said exhaust system; and electrical connector means for collecting electrical current from remotely located edges of said plates and conducting the same to a utilization device whereby pulse combustion cycles taking place in said combustion chamber heating said edges of said plates cause generation of an electrical current at said remote edges which is collected and conducted to said utilization device.

2. The thermoelectric generator according to claim 1 wherein said plates are of annular shape each having a central opening aligned with the opening of the remaining plates, said openings together defining said combustion chamber, exhaust pipe, and exhaust decoupler.

3. The thermoelectric generator according to claim 1 wherein said stack of plates include aligned pairs of segments of stacked plates with edges thereof disposed side-by-side, and with intervening cut outs forming a central opening through which extends said air passage.

4. The thermoelectric generator according to claim 3 wherein a pair of housing sections are provided, each comprised of a respective stack of said segments of plates, said segments of plates arranged in a series of spaced apart pairs to define a generally semicircular shaped intervening opening, and which housing sections are assembled together to form an open air passageway defined by said intervening opening.

5. The thermoelectric generator according to claim 1 wherein said exhaust system includes an exhaust pipe and a divergent exhaust decoupler receiving gases expanding out of said combustion chamber.

6. The thermoelectric generator according to claim 5 wherein said exhaust pipe comprises a wall able to be swung out at one end to create an adjustable degree of divergence.

7. The thermoelectric generator according to claim 1 wherein said exhaust system includes a first exhaust pipe extending from said combustion chamber, said first exhaust pipe having a series of bends of increased flow resistance closer to the combustion chamber.

8. The thermoelectric generator according to claim 7 wherein a second exhaust pipe also extends from said combustion chamber, said second exhaust pipe having a series of bends therein.

9. A method of generating electricity comprising the steps of:

carrying out a pulse combustion process in a combustion chamber and allowing gases to explosively expand into an exhaust system;

establishing a greater resistance to outflow of said gases in said exhaust system at points closer to said combustion chamber than at points further downstream from said combustion chamber;

surrounding said combustion chamber and at least a part of said exhaust system with a thermopile comprised of alternating layers of material having a thermoelectric effect when subjected to a temperature difference at one end joined together, said layers joined together along one edge adjacent to said combustion chamber to be heated thereby; and, conducting electrical current generated thereby away from other sides of said layers to a utilization device.

10. The method according to claim 9 wherein said step of establishing flow resistance includes the step of establishing said decreasing flow resistance in correspondence with the Nusselt number (Nu) of said flow of gases in said exhaust system, said Nusselt number correlated as follows:

$$Nu = 0.023\, Re^{0.8}\, Pr^{1/3}$$

where Re is the Reynolds number and Pr is the Prandtl number.

* * * * *